United States Patent [19]

Blodgett et al.

[11] Patent Number: 5,455,801
[45] Date of Patent: Oct. 3, 1995

[54] CIRCUIT HAVING A CONTROL ARRAY OF MEMORY CELLS AND A CURRENT SOURCE AND A METHOD FOR GENERATING A SELF-REFRESH TIMING SIGNAL

[75] Inventors: Greg A. Blodgett, Eagle; Todd A. Merritt, Boise, both of Id.

[73] Assignee: Micron Semiconductor, Inc., Boise, Id.

[21] Appl. No.: 275,576

[22] Filed: Jul. 15, 1994

[51] Int. Cl.$^6$ .................................................. G11C 7/00
[52] U.S. Cl. ........................ 365/222; 365/203; 365/210
[58] Field of Search ..................................... 365/222, 203, 365/210, 236

[56] References Cited

U.S. PATENT DOCUMENTS

| | | | |
|---|---|---|---|
| 4,682,306 | 7/1987 | Sakurai et al. | 365/222 |
| 4,982,369 | 1/1991 | Tatematsu | 365/210 |
| 5,375,093 | 12/1994 | Hirano | 365/222 |
| 5,392,251 | 2/1995 | Manning | 365/222 |

Primary Examiner—Joseph A. Popek
Assistant Examiner—Tan Nguyen
Attorney, Agent, or Firm—Susan B. Collier

[57] ABSTRACT

A method and circuit for generating a self-refresh mode signal and a self-refresh cycle signal. The circuit is a dynamic random access memory (DRAM) device having a control array of control cells charged to a potential by a current source and having a monitor circuit for monitoring the potential of the control array. The DRAM comprises a discharge circuit which discharges the potential of the control array in response to the monitor circuit detecting when the potential of the control array has reached a trip point. A counter circuit counts the number of cycles of charge and discharge and generates the self-refresh mode signal after a desired count is reached. The counter circuit continues to count the number of cycles of charge and discharge while in the refresh mode and generates a self-refresh cycle signal each time the counter circuit counts a desired number of counts.

24 Claims, 3 Drawing Sheets

1

CIRCUIT HAVING A CONTROL ARRAY OF MEMORY CELLS AND A CURRENT SOURCE AND A METHOD FOR GENERATING A SELF-REFRESH TIMING SIGNAL

CROSS REFERENCE TO RELATED APPLICATIONS

This application is being filed simultaneously with and contains similar material to copending application having disclosure number 94-0163, U.S. patent application Ser. No. 08 275,693 entitled "A LOCKOUT CIRCUIT AND METHOD FOR PREVENTING METASTABLILTY DURING THE TERMINATION OF A REFRESH MODE".

1. Field of the Invention

The invention relates to self-refreshing dynamic random access memories (DRAMs), and more particularly to circuits on the DRAM for generating self-refresh timing signals for determining the period of the refresh cycle and for generating the self-refresh mode signal.

2. Background of the Invention

A self-refreshing DRAM is a dynamic random access memory which has an autonomous refresh circuit.

DRAMs are comprised of a plurality of memory storage cells in which each cell consists of a transistor and an intrinsic capacitor. The transistors are used to charge and discharge the capacitors to certain voltage levels. The capacitors then store the voltages as binary bits, 1 or 0, representative of the voltage levels. The binary 1 is referred to as a "high" and the binary 0 is referred to as a "low". The voltage value of the information stored in the capacitor of a memory cell is called the logic state of the memory cell. Due to capacitance leakage, the memory storage cells must be refreshed periodically during a refresh mode to keep the capacitors charged or discharged to ensure memory preservation. A refresh cycle normally involves cycling through the memory and performing a read/write operation in each row of the memory, in turn. A sleep mode is typically characterized as a low power mode having no active read or write operations during which data retention is desired. It is typically necessary to refresh each row of memory in the DRAM device within a time period of 4 to 256 milliseconds for data retention.

In order for refresh to occur, an external row address strobe signal* (RAS*) and an internally generated self-refresh timing signal must typically be active. When RAS, transitions to an inactive state, the refresh mode is typically exited. Automatic exiting of the refresh mode without regard to the state of the internally generated self-refresh timing signal may cause metastability of the DRAM due to glitches caused by external RAS* and the internal self-refresh timing signal opposing one another.

Thus there exists a need to prevent glitches from occurring during a termination of a self-refresh mode when a race condition exits between an external RAS* transitioning to an inactive state and an internally generated self-refresh timing signal transitioning to an active state.

There is also a need to vary the period of the refresh cycle and the period of the refresh mode to adjust the rate of refresh for changes in voltage and temperature. Changes in voltage and temperature may vary the rate of leakage of the memory storage cells requiring more or less frequent refreshing of the DRAM.

SUMMARY OF THE INVENTION

The invention is a method for generating an internal clock signal and is a dynamic random access memory device having an oscillator circuit for generating the internal clock signal. The DRAM device has a plurality of memory storage cells for storing electronic data. A counter counts the pulses of the internal clock signal and generates a self-refresh mode signal for initiating the self-refresh mode in the DRAM device and generates a self-refresh cycle signal for initiating each self-refresh cycle during the self-refresh mode. The oscillator circuit comprises a control memory cell, a current source, a monitor circuit and a discharge circuit. The current source charges the control memory cell and the monitor circuit monitors the potential of the control memory cell to determine when the potential of the control memory cell reaches a trip point. The discharge circuit discharges the control memory cell when the potential on the control memory cell reaches the trip point. The rate of charge and discharge of the control memory cell determines the frequency of the internal clock signal.

The control memory cell is fabricated substantially identically to the memory storage cells of the DRAM device. Since the fabrication is substantially identical, the control memory cell and the memory storage cells have similar reactions to changes in voltage and temperature. Thus the rate of charge and discharge of the control memory cell determines the frequency of the internal clock signal which in turn determines a refresh rate of the DRAM.

DETAILED DESCRIPTION OF THE INVENTION

The invention is a self-refreshing dynamic random access memory (DRAM) device having a plurality of memory storage cells for storing electronic data. The memory storage cells leak charge and must be refreshed. In one embodiment the invention is an oscillator circuit of the self-refreshing DRAM. The oscillator circuit of the invention generates an internal clock signal. A counter counts the pulses of the internal clock signal and generates a self-refresh mode signal for initiating the self-refresh mode in the DRAM device and generates a self-refresh cycle signal for initiating each self-refresh cycle during the self-refresh mode.

Figure 1:
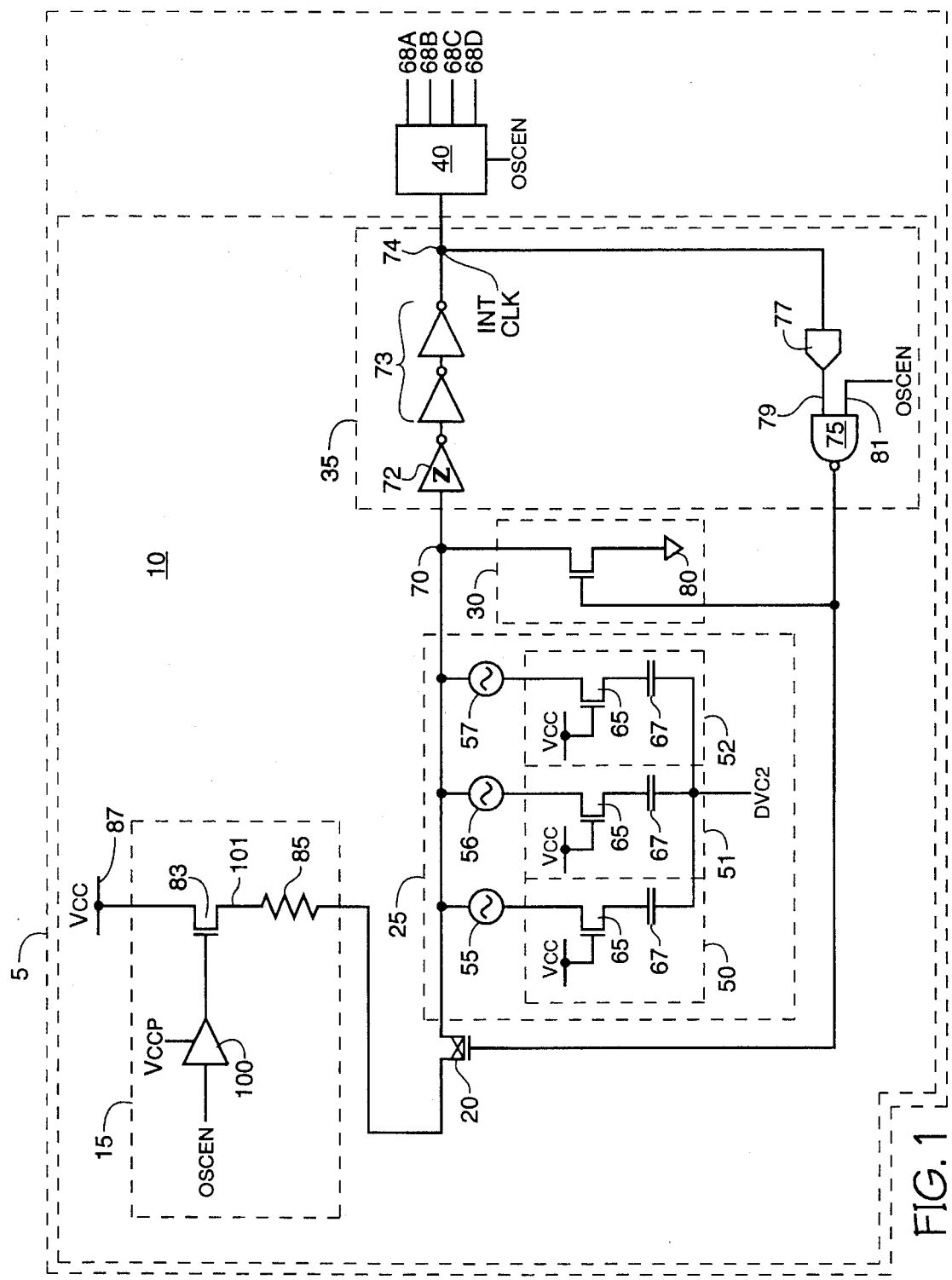
FIG. 1 is a schematic of the oscillator circuit of the invention.

FIG. 1 is a schematic of a DRAM device 5 having the oscillator circuit 10 of the invention. The oscillator circuit 10 functions as a timing circuit and generates at lest one self-refresh timing signal. The oscillator circuit 10 comprises a current source 15, a switching device 20, a capacitor portion 25, a discharge circuit 30, and a monitor circuit 35. The DRAM device 5 also has a counter 40 for counting the internal clock signal generated by the oscillator circuit.

The capacitor portion 25 is charged to a potential by current source 15 when switching device 20 is actuated. The monitor circuit 35 monitors the potential of node 70. Node 70 is driven to a potential equal to the potential stored in capacitor portion 25. The monitor circuit 35 signals the discharge device 30 and switching device 20 when the potential reaches a desired value and provides an internal clock signal to the counter 40.

The capacitor portion 25 comprises three control arrays 50–52. Although each control array 50–52 is represented by only one control cell in the figure, each control array 50–52 actually comprises a plurality of control cells. In this embodiment there are 36 control cells in each control array 50–52. Although the exact number of control cells may vary it is advisable to use a sufficient number of control cells to ensure that an average cell of the control arrays 50–52 is representative of an average memory storage cell of the self-refreshing DRAM. The control cells are fabricated to have the same structure and size as the memory storage cells of the DRAM, although larger geometries may be used to ensure manufacturability. Using identical fabrication during array fabrication ensures that control arrays 50–52 and the memory storage arrays of the DRAM react identically to changes in temperature and voltage. Each control cell is a continually actuated transistor 65 connected serially to a storage capacitor 67.

Each control array 50–52 can be electrically isolated from the circuit by opening a fuse 55–57, respectively. Electrically isolating a control array increases the frequency of the self-refresh timing signal.

The potential on node 70 is inverted in schmitt trigger 72 and is buffered in inverters 73 to generate the internal clock signal at node 74. The schmitt trigger has a high trip point and a low trip point. When the potential at node 70 reaches the high trip point the output of the schmitt trigger is inverted from its input potential on node 70 after a time delay internal to the schmitt trigger. The output of the schmitt trigger does not transition again until the potential at node 70 decreases to the low trip point of the schmitt trigger. Node 74 is the clock input node to counter 40. The internal clock signal represents the inverse of the potential of capacitors 67 when they are charged and discharged. The internal clock signal has a period. The counter circuit 40 counts the number of periods of the internal clock signal and generates an active self-refresh mode signal at node 68A and generates self-refresh cycle signals at nodes 68B–D. The first active self-refresh timing signal following the enablement of the oscillator circuit 10 is a self-refresh mode signal for initiating self-refresh in the DRAM device 5. The self-refresh mode signal is driven to node 68A. The self-refresh timing signals following the self-refresh mode signal are self-refresh cycle signals. The self-refresh cycle signals are driven to nodes 68B–D. The DRAM 5 is refreshed in response to the self-refresh cycle signal until the self-refresh mode is exited.

The internal clock signal at node 74 is also fedback to NAND gate 75 through delay circuit 77. The NAND gate 75 output signal controls the charge and discharge of the capacitor portion 25. When the potential on node 70 reaches the high trip point of the schmitt trigger 72, node 74 goes low after a time delay. The low on node 74 is further delayed through delay circuit 77 and takes the output of NAND gate 75 to a high potential. The high potential deactuates p-channel transistor 20 and actuates the n-channel transistor of discharge circuit 30 discharging the capacitor portion 25 through the transistor of discharge circuit 30. When the potential of node 70 reaches the low trip point of the schmitt trigger 72, the output of the schmitt trigger 72 transitions to a high potential, and the potential of node 74 transitions to a high which is delayed in delay circuit 77. The high potential fed back to NAND input node 79 causes the output of the NAND gate 75 to go low when the oscillator enable signal on input node 81 is high. The low NAND gate 75 output signal actuates transistor 20 coupling current source 15 to the capacitor portion 25 and deactuates the transistor of discharge circuit 30 isolating the capacitor portion 25 from the ground potential at reference node 80. The capacitor portion 25 now begins to recharge to a high potential through actuated transistor 20.

The current source 15 comprises an n-channel transistor 83 for sourcing current between the capacitor portion 25 and a supply potential ($V_{cc}$, typically equal to potential lying between 5 Volts and 3 volts), connected at node 87, during the charging of the capacitor portion 25 and comprises a resistor 85 for controlling the amount of current sourced. An oscillator enable signal (OSCEN), generated in response to external signals, is driven to the gate of transistor 83 through a level translating buffer circuit 100 to control the activation and deactivation of n-channel transistor 83. The level translating buffer circuit 100 buffers a potential to the gate of transistor 83 which is large enough to pull the potential of node 101 to the full $V_{cc}$ potential at node 87 when transistor 83 is actuated.

Figure 2:
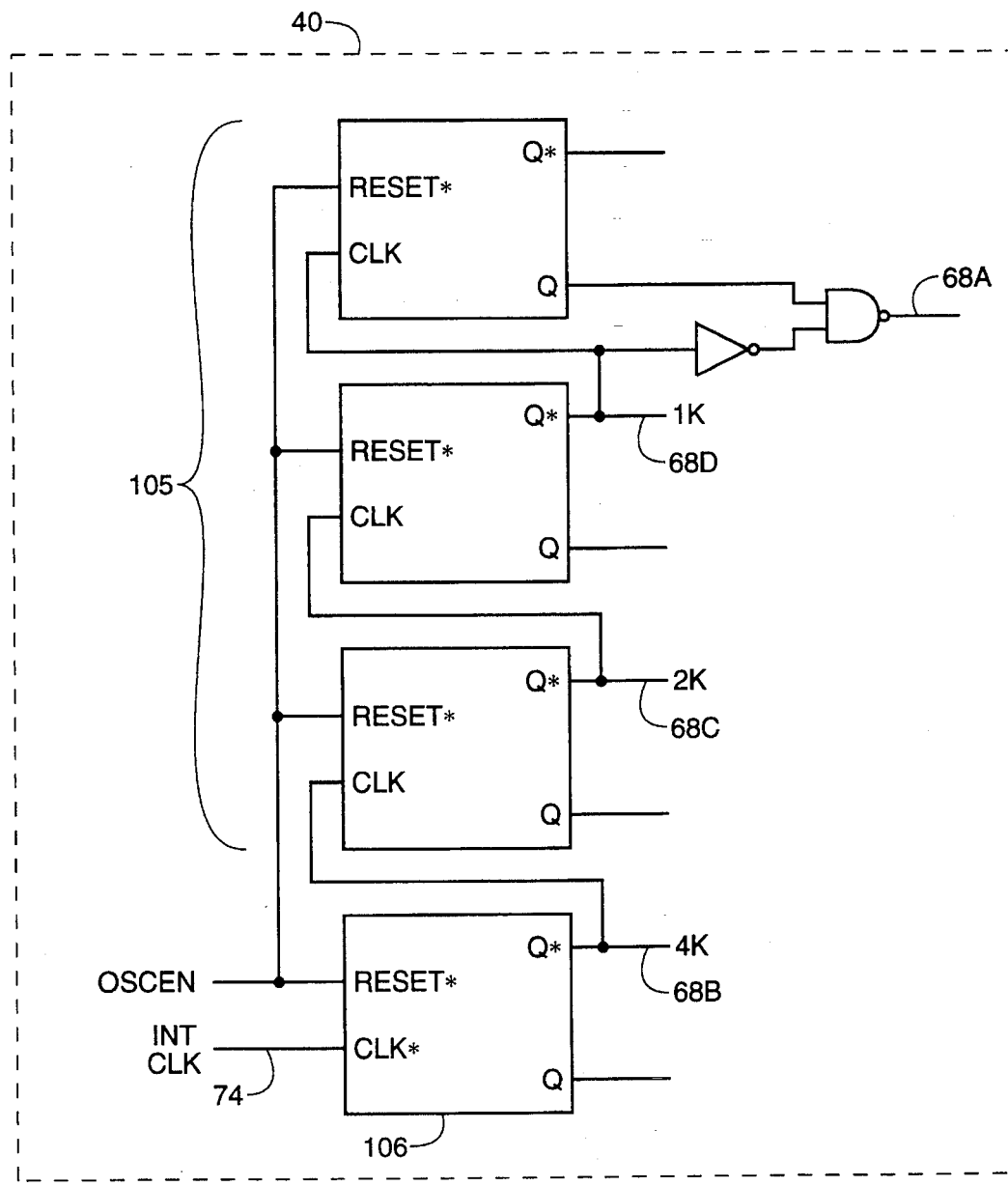
FIG. 2 is a detailed schematic of a counter circuit.

Counters are well known in the art. FIG. 2 is one possible counter circuit which may be used for counter 40 in the DRAM of the invention. Like components in FIGS. 1 and 2 are numbered the same. The counter 40 comprises 3 positive edge triggered flip-flops 105 and a negative edge triggered flip flop 106.

The frequency of the monitor signal at node 74 is approximately 75KHz with all three fuses 55–57 electrically conductive. The counter 40 provides the self-refresh mode signal at node 68A after 24 periods of the internal clock signal. The self-refresh mode has a timeout approximately equal to 300 micro seconds. The counter also provides self-refresh cycle signals at nodes 68B, 68C, and 68D having frequencies of 18.75KHz, 9.4KHz and 4.7KHz for generating row address strobe(RAS)* pulses for 4K, 2K or 1K refresh parts, respectively. This corresponds to a refresh rate of 200 milliseconds.

Figure 3:
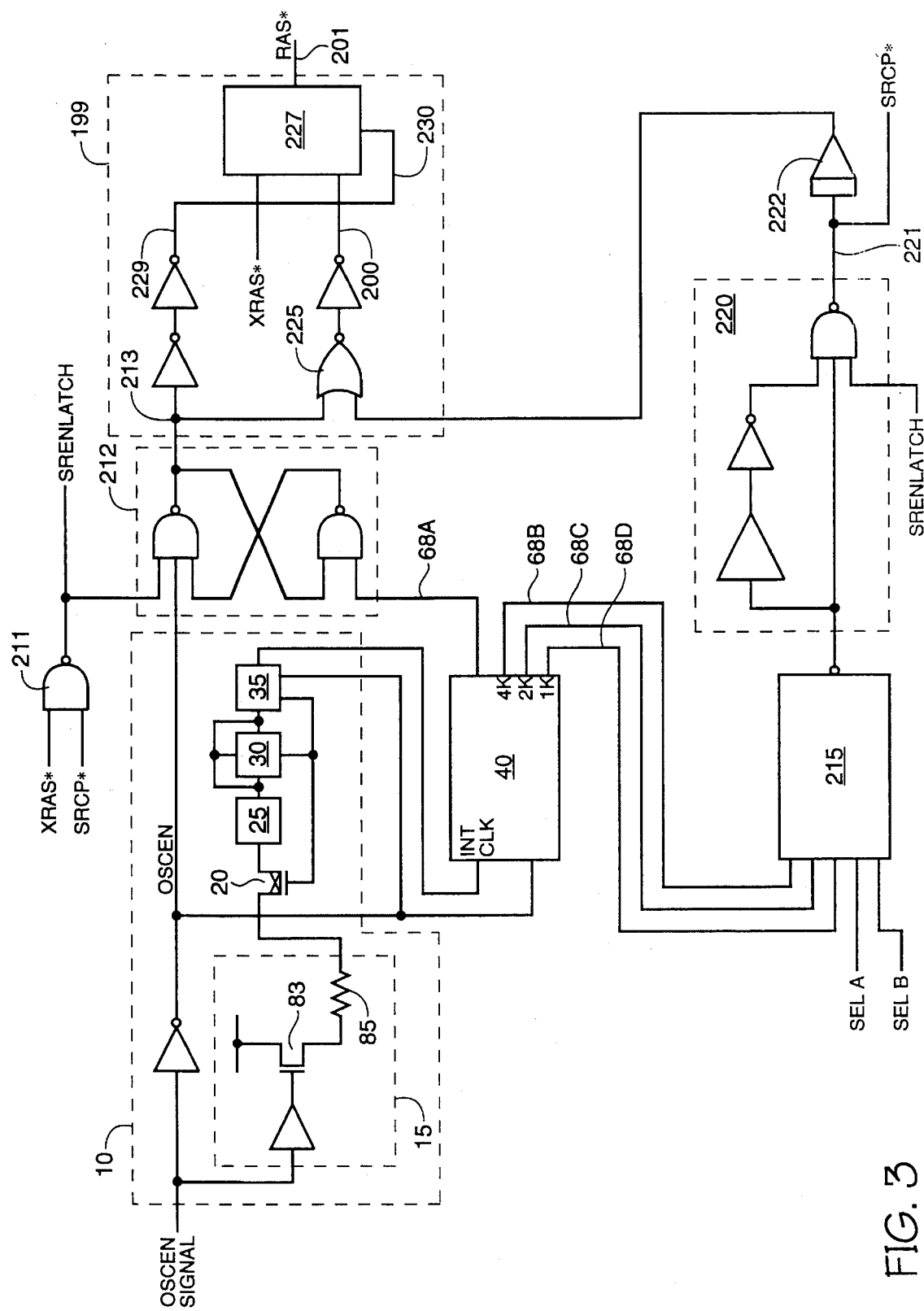
FIG. 3 is a schematic of a portion of a dynamic random access memory device of the invention.

In FIG. 3 a further embodiment of the invention is shown. Like components in FIGS. 1 and 3 are numbered the same. The oscillator enable signal, generated in response to a CAS before RAS (CBR), is buffered to current source 15 where it controls the activation and deactivation of transistor 83. (CAS is column address strobe.) The oscillator enable signal is also inverted to the input of the monitor circuit 35 and to an input of the counter circuit 40.

The self-refresh mode signal at output node 68A of counter 40 is designed to enable an output circuit portion 199 to drive a self-refresh cycle pulse* (SRCP*) signal from node 200 to an output node 201. A NAND gate 211 is used to lock out an inactive external RAS* (XRAS*) occurring during the generation of an active SRCP* so that glitches do not occur during exit from the self-refresh mode. A latch 212 is used to latch the active self-refresh mode signal, in this case a low, to node 213 when the output signal, SRENLATCH (self-refresh enable latch), of NAND gate 211 is high in order that the self-refresh mode is not exited by the self-refresh mode signal on 68A transitioning. At the termination of refresh SRENLATCH transitions low and disables a generation of the active SRCP*.

A 4K self-refresh cycle signal, a 2K self-refresh cycle signal, and a 1-K self-refresh cycle signal are available at counter output nodes 68B–D respectively and are multiplexed in a three to one multiplexer 215 which is controlled by two select input signals, SELA and SELB, which together determine whether the part is a 4K, 2K or 1K refresh part. The output of the multiplexer 215 is an input signal to pulse generator 220. In the present embodiment the pulse generator 220 provides a 15 nanosecond active SRCP* pulse at node 221 when enabled by a high SRENLATCH signal at the output of NAND gate 211. The SRCP* is active low. The SRCP* is an input to NAND gate 211. When the XRAS* is active, low, the output, SRENLATCH, of NAND gate 211 is high. Thus if XRAS* transitions high during the termination of the self-refresh cycle and the SRCP* is low the output signal, SRENLATCH, of NAND gate 211 remains high thereby locking out the transition of XRAS* until the SRCP* transitions high.

It is possible within the scope of the invention to use a pulse generator which generates pulses having pulse widths other than 15 nanoseconds.

On the other hand if the XRAS* signal transitions high when SRCP* is high, the NAND gate 211 output, SRENLATCH, goes low. The low SRENLATCH is fed back as an input to pulse generator 220. The low SRENLATCH disables pulse generator circuit 220 and SRCP* remains high thereby latching a high to node 213 allowing a glitch free exit from the self-refresh mode. Thus NAND gate 211 and the latch circuit 212 form a lock out circuit which locks out a transition in XRAS* or a transition of the SRCP* at the termination of the self-refresh mode.

The SRCP* at node 221 is delayed in delay circuit 222 to the input of NOR gate 225 which is enabled and disabled by the signal latched to node 213 by latch circuit 212. This delay ensures that the active SRCP* does not reach the NOR gate 225 before NOR gate 225 is properly enabled or disabled. This delay is particularly important in the case where the SRCP* begins to transition to an active state following the transition of the XRAS* to the inactive state. The SRCP* is delayed in delay circuit 222 in order to allow node 213 to transition high thereby disabling the NOR gate 225.

Multiplexer 227 in an output circuit portion 199 provides an internal RAS pulse at its output node 201. During the self-refresh mode the SRCP* on node 200 is multiplexed to the output by the active self-refresh mode signal on node 213 which is buffered to node 230 to function as a select input to multiplexer 227. When XRAS* transitions high and the SRCP* is high the latch drives the potential of node 213 to a high potential. The high potential on node 213 is buffered to node 230 where it selects XRAS* as the internal RAS output signal of multiplexer 227. Thus the invention prevents metastability during an exit from the self-refresh mode.

While this invention has been described with reference to an illustrative embodiment, this description is not intended to be construed in a limiting sense. Various modifications as well as other embodiments will be apparent to persons skilled in the art upon reference to this description. It is, therefore contemplated that the appended claims cover any such modifications or embodiments as fall within the true scope of the invention.

What is claimed is:

1. A dynamic random access memory device having a plurality of memory storage cells for storing electronic data, the dynamic random access memory device performing a refresh in order to refresh the data, the dynamic random access memory device generating a refresh timing signal for controlling a timing of the refresh, the dynamic random access memory device comprising:

a) a self-refresh memory array having control memory cells capable of charge and discharge;

b) a current source for charging each of the control memory cells to a potential;

c) a monitor circuit for monitoring the potential on the control memory cells and for generating a discharge signal in response to the potential on the control memory cells reaching a trip point;

d) a discharge circuit for discharging the control memory cells in response to the discharge signal, a period of one charge time and one discharge time determining a charge-discharge cycle; and e) a counter for counting a number of occurrences of the charge-discharge cycle and for generating the refresh timing signal in response to a desired number of said occurrences.

2. A dynamic random access memory device having a plurality of memory storage cells for storing electronic data, the dynamic random access memory device performing a refresh in order to refresh the data, said dynamic random access memory device having an oscillator circuit for generating an internal clock signal for controlling a timing of the refresh, the oscillator circuit comprising:

a) a self-refresh memory array having control memory cells capable of charge and discharge;

b) a current source for charging each of the control memory cells to a potential;

c) a switching device interposed between said self-refresh memory array and said current source, said switching device, when actuated, allowing current to pass between said current source and said self-refresh memory array to perform the charging of each of said control memory cells, and said switching device electrically isolating said current source from said self-refresh memory array when deactuated; and d) a monitor circuit for monitoring the potential on the control memory cells and for generating a first signal in response to the potential on the control memory cells reaching a first trip point during the charging of each of said control memory cells and for generating a second signal in response to the potential on the control memory cells reaching a second trip point during the isolating of said current source from said self-refresh memory array, said internal clock signal comprising said first signal and said second signal.

3. The dynamic random access memory device as specified in claim 2, further comprising a discharge circuit for discharging the potential of the control memory cells in response to the first signal, said switching device deactuated in response to said first signal, wherein said switching device is actuated in response to said second signal and said discharging of said discharge circuit is terminated in response to said second signal.

4. The dynamic random access memory device as specified in claim 2, further comprising a counter for counting a number of occurrences of the internal clock signal and for generating a self-refresh timing signal in response to a desired number of said occurrences.

5. The dynamic random access memory device as specified in claim 4, wherein the refresh timing signal comprises:

a) a self-refresh cycle signal for determining a period of the refresh in the dynamic random access memory device; and b) a self-refresh mode signal for enabling said self-refresh cycle signal.

6. A dynamic random access memory device having a plurality of memory storage cells for storing electronic data, the dynamic random access memory device performing a refresh in order to refresh the data, said dynamic random access memory device having an oscillator circuit for generating an internal clock signal for controlling a timing of the refresh, the oscillator circuit comprising:

a) a control memory cell capable of charge and discharge;

b) a current source for charging said control memory cell to a potential;

c) a monitor circuit for monitoring the potential on said control memory cell to determine when the potential of said control memory cell reaches a trip point; and d) a discharge circuit for discharging said control memory cell in response to the potential on said control memory cell reaching the trip point, a rate of the charge and the discharge of said control memory cell determining a frequency of the internal clock signal.

7. The dynamic random access memory device as specified in claim 6, wherein said control memory cell is fabricated substantially identically to the plurality of memory storage cells such that said control memory cell and the plurality of memory storage cells react substantially identically to changes in voltage and temperature.

8. The dynamic random access memory device as specified in claim 6, further comprising a counter for counting cycles of the charge and the discharge.

9. The dynamic random access memory device as specified in claim 8, wherein said counter has a first output node and a second output node, a self-refresh mode signal available at said first output node, an active said self-refresh mode signal enabling the dynamic random access memory device for the refresh, and a self-refresh cycle signal available at the second output node, said self-refresh cycle signal determining a rate of refresh of the dynamic random access memory device.

10. The dynamic random access memory device as specified in claim 8, wherein said counter generates a self-refresh mode signal in response a first number of the cycles of the charge and the discharge and generates a self-refresh cycle signal in response to a second number of the cycles of the charge and the discharge, said self-refresh mode signal allowing said self-refresh cycle signal to determine the timing of the refresh.

11. The dynamic random access memory device as specified in claim 6, further comprising:

a) a counter circuit for generating a self-refresh mode signal in response to a first number of cycles of the charge and the discharge and for generating a self-refresh cycle signal in response to a second number of the cycles of the charge and the discharge; and b) a latch circuit for latching an active state of said self-refresh mode signal to a latch node thereby enabling the dynamic random access memory device for the refresh.

12. The dynamic random access memory device as specified in claim 11, further comprising a pulse generator for generating an active refresh pulse having a desired pulse width in response to the self-refresh cycle signal.

13. The dynamic random access memory device as specified in claim 12, further comprising a gate circuit for locking out an effect of an occurrence of the active refresh pulse when an external row address strobe signal is in an inactive state and for locking out an effect of a transition of said external row address strobe to an inactive state when said active refresh pulse is present, said gate circuit controlling said latch circuit in order to retain the active self-refresh mode signal at the latch node during the locking out of the effect of the occurrence of the active refresh pulse when an external row address strobe signal is in the inactive state and during the locking out of the effect of the transition of said external row address strobe signal to the inactive state when said active refresh pulse is present thereby preventing metastability at a termination of the refresh.

14. A method for generating a self-refresh timing signal in a dynamic random access memory device comprising the following steps:

a) charging a control memory cell to a potential;

b) monitoring the potential of the control memory cell;

c) discharging the potential of the control memory cell when the potential of the control memory cell reaches a trip point said charging and discharging creating a charge-discharge cycle having a period;

d) counting the cycles of said charge-discharge cycle to generate the self-refresh timing signal after a desired number of the cycles have been counted; and e) refreshing memory storage cells of said dynamic random access memory in response to said self-refresh timing signal.

15. The method as specified in claim 14 further comprising the step of fabricating said control memory cell and said memory storage cell substantially identically.

16. The method as specified in claim 14 further comprising the following steps:

a) actuating a charge switching device; and b) sourcing current between a supply potential and said control cell through said charge switching device to perform said step of charging.

17. The method as specified in claim 14, further comprising the following steps:

a) actuating a discharge switching device; and b) sinking current between between a reference node, connectable to a reference potential, and said control cell through said discharge switching device to perform said step of discharging.

18. A method for generating a self-refresh timing signal in a dynamic random access memory comprising the following steps:

a) sourcing current between a control memory cell and a current source;

b) charging the control memory cell to a potential with said current;

c) monitoring the potential of the control memory cell;

d) terminating said step of sourcing in response to the potential of the control memory cell reaching a first trip point;

e) discharging the potential of the control memory cell in response to the potential of the control memory cell reaching the first trip point;

f) terminating said step of discharging in response to the potential of the control memory cell reaching a second trip point;

g) recharging the control memory cell in response to the potential of the control memory cell reaching the second trip point;

h) counting a number of periods of said charging and said discharging;

i) issuing a self-refresh timing signal in response to a desired number of said periods counted; and j) refreshing memory storage cells of said dynamic random access memory in response to said self-refresh timing signal.

19. A method for refreshing a dynamic random access memory device having memory storage cells for storing data, the method comprising the following steps:

a) fabricating a control memory array to have a reaction to voltage and temperature changes representative of a reaction of the memory storage cells to said voltage and said temperature changes;

b) charging said control memory array;

c) discharging said control memory array;

d) generating a self-refresh cycle signal in response to said steps of charging and discharging;

e) generating a self-refresh mode signal in response to said steps of charging and discharging;

f) enabling the self-refresh cycle signal with said self-refresh mode signal when an externally generated row address strobe signal is active; and g) refreshing the dynamic random access memory device in response to the self-refresh cycle signal.

20. A method for refreshing a dynamic random access memory device having memory storage cells for storing data, the method comprising the following steps:

a) fabricating a control memory array to have a reaction to voltage and temperature changes representative of a reaction of the memory storage cells to said voltage and said temperature changes;

b) charging said control memory array;

c) discharging said control memory array;

d) generating a self-refresh cycle signal in response to said steps of charging and discharging;

e) generating a self-refresh mode signal in response to said steps of charging and discharging;

f) enabling the dynamic random access memory device for the refreshing in response to the self-refresh mode signal; and g) refreshing the memory storage cells in response to the self-refresh cycle signal.

21. The method as specified in claim 20, further comprising the following steps:

a) monitoring a potential of said control memory array;

b) providing a charging signal in response to said potential of said control memory array decreasing to a low trip point, said step of charging performed in response to said charging signal; and c) providing a discharging signal in response to said potential of said control memory array increasing to a high trip point, said step of discharging performed in response to said discharging signal.

22. The method as specified in claim 20, further comprising the following steps:

a) generating an active self-refresh pulse having a desired pulse width in response to said self-refresh cycle signal;

b) latching said self-refresh mode signal to an enable node in order to perform said step of enabling in response to an external row address strobe signal being in an active state; and c) disabling the dynamic random access memory device for the refreshing when said active self-refresh pulse transitions to an inactive state and when said external row address strobe signal is in an inactive state.

23. The method as specified in claim 22, further comprising the step of locking out an effect of said externally generated row address strobe signal going to an inactive state when said active self-refresh pulse is present, said step of locking out eliminating metastability during said step of disabling.

24. The method as specified in claim 22, further comprising the step of locking out an effect of said active self-refresh pulse when said active self-refresh pulse occurs subsequent to said step of disabling, said step of locking out eliminating metastability during said step of disabling.

* * * * *